(12) United States Patent
Reyzelman et al.

(10) Patent No.: US 6,703,080 B2
(45) Date of Patent: Mar. 9, 2004

(54) METHOD AND APPARATUS FOR VHF PLASMA PROCESSING WITH LOAD MISMATCH RELIABILITY AND STABILITY

(75) Inventors: Leonid E. Reyzelman, Rochester, NY (US); John E. Sortor, Norristown, PA (US)

(73) Assignee: ENI Technology, Inc., Rochester, NY (US)

( * ) Notice: Subject to any disclaimer, the term of this patent is extended or adjusted under 35 U.S.C. 154(b) by 0 days.

(21) Appl. No.: 10/151,425

(22) Filed: May 20, 2002

(65) Prior Publication Data

US 2003/0215373 A1 Nov. 20, 2003

(51) Int. Cl.$^7$ ............... B05D 1/00; C23C 16/00; H01L 21/306; H03G 3/00
(52) U.S. Cl. ............ 427/445; 204/192.1; 204/298.08; 118/723 E; 118/723 I; 156/345.48; 216/67; 330/199; 330/123; 330/127
(58) Field of Search ............... 204/192.1, 298.08; 118/723 E, 723 I; 427/445; 156/345.48; 216/67; 330/199, 123, 127

(56) References Cited

U.S. PATENT DOCUMENTS

| | | | | |
|---|---|---|---|---|
| 5,175,472 A | | 12/1992 | Johnson, Jr. et al. | ... 315/111.21 |
| 5,477,188 A | * | 12/1995 | Chawla et al. | ............. 330/269 |
| 6,020,794 A | * | 2/2000 | Wilbur | ...................... 333/17.1 |
| 6,130,910 A | * | 10/2000 | Anderson et al. | ........... 375/238 |
| 6,256,482 B1 | * | 7/2001 | Raab | ........................ 455/108 |
| 2002/0007794 A1 | * | 1/2002 | Byun et al. | ........... 118/723.001 |

* cited by examiner

*Primary Examiner*—Steven H. VerSteeg
(74) *Attorney, Agent, or Firm*—Harness, Dickey & Pierce, P.L.C.

(57) ABSTRACT

A radio frequency (RF) generator apparatus for a plasma processing system that is resistant to nonlinear load mismatch conditions is provided. The apparatus includes an RF oscillator configured to generate an RF signal, an RF amplifier responsive to the RF signal to produce a VHF RF signal having sufficient power to drive a plasma chamber load, and a VHF-band circulator coupled to the amplifier and configured to isolate nonlinearities of the plasma chamber load from the amplifier.

24 Claims, 10 Drawing Sheets

METHOD AND APPARATUS FOR VHF PLASMA PROCESSING WITH LOAD MISMATCH RELIABILITY AND STABILITY

FIELD OF THE INVENTION the present invention relates to high power plasma processing system and more particularly to method and apparatus for providing VHF high power radio frequency energy to plasma processing systems under severe non-linear load mismatch conditions.

BACKGROUND OF THE INVENTION

Plasma processing systems are used worldwide in the semiconductor industry for thin film fabrication to create desired patterns on a semiconductor wafer.

Radio frequency (RF) power, produced and closely regulated by an RF generator, is used to create a high-energy environment inside a plasma chamber, which is a glass box filled with inert gas at low pressure. Within this environment, layers of silicon can be removed by etching and other chemical layers can be added by sputtering and chemical vapor deposition with microscopic precision, until a desired composition is achieved.

By changing electrical characteristics of a raw material such as a silicon wafer during plasma processing, integrated circuits (ICs) such microprocessors, random-access memories, etc., or compact discs are manufactured.

Chipmakers designing the next generation of ICs face tremendous technical challenges in plasma processing applications. These challenges include, but are not limited to, tighter control and precision measurements of film thickness, water temperature, gas and flow pressure, and distribution of contaminations inside the chamber. On the other hand, in the chip fabrication environment, the plasma etching process alone can account for up to half of the total wafer scrap. Therefore, reliability and stability are critical elements that determine plasma tool performance in reducing scraped wafers and eventually the cost of ICs. These challenges become even greater taking into consideration that plasma equipment makers are now implementing systems capable of producing 0.1 $\mu$m and lower devices on a 300-mm wafers.

A typical plasma processing arrangement used for chip fabrication generally includes as main equipment an RF power generator, an impedance matching network and a plasma chamber coupled to a system by RF power cables.

The highly automated plasma processing apparatus is controlled by the system controller. Many plasma processing systems use radio frequency (RF) energy in the LF (250 kHz–400 KHz), MF (2 MHz, 4 MHz) and HF (13.56 MHz, 27.12 MHz) ranges of the RF spectrum. VHF (as used herein, 40–300 MHz) high power generators are more complex, but provide better uniformity of the ion and radial flux across the wafer, lower variation in the rate of etching between wafers and within each wafer, higher chips productivity and repeatability, which result in higher production yield and lower cost. Thus, VHF plasma processing systems are attractive to system designers and chip manufactures.

Plasma etching reactors generally comprise two large parallel electrodes contained within an evacuated chamber. The chamber is filled with a small amount of etching gases mixed at precision flow rate and pressure, and a silicon wafer to be processed placed on a lower electrode of the two electrodes. A high power RF signal is applied between electrodes to convert the gas into a plasma, which is high energy, charged collection of ionized atoms and molecules. One advantage of the plasma is the ability to produce highly reactive particles-ions at a relatively low temperature. In all plasma techniques a shower of electrons generated by the electrodes strikes the low pressure gas between the electrodes. The collections fragment molecules into ions and radicals. In plasma etching these activated species strike the wafer and ablate the surface. After a predetermined sequence of such operations, electrical components are created.

The etching rate of the plasma system and the consistency of the final etched pattern depend greatly upon efficient and consistent coupling of RF power from the RF generator to the electrode plates of the plasma chamber. Efficient power coupling from the generator to the load (plate electrodes) occurs when the load impedance of the plate electrodes has a value equal to the complex conjugate of the generator's ouput characteristic impedance.

High power RF generators are usually designed so that their output impedance is a resistance of 50 Ohms and a reactance of zero Ohm. The input impedance of the reactor is determined by external conditions, namely, the magnitude of power transferred by the matching network from the RF generator, and a plurality of internal conditions. These conditions include, but are not limited to, type of gas mix, flow rate and pressure, and temperature of the raw gas. In the pre-ignition stage the gas in the chamber is not ionized and not conductive. Therefore, the load impedance of the plate electrodes is very high and extremely mismatched from the RF generator output impedance. At the time of ignition the raw gas in the reactor begins to ionize under the power from RF power supply and converts into a plasma, resulting in the load impedance of the chamber dropping dramatically. During this transient, because of significant deviation of the plasma load impedance, the generator will receive reflected power from the reactor. Any increase in RF forward power, due to low load impedance, may result in 100% of the generated power being reflected back to the generator. This leads to current and power dissipation or voltage overstress of the transistors in the power amplifier (PA) modules of the RF generator.

Even during the plasma-sustaining period, the plasma density may vary several orders of magnitude, resulting in a substantial impedance mismatch. There is thus general agreement that, in a plasma processing environment, the plasma reacts as a dynamic extremely nonlinear load. Furthermore, it has been generally agreed that repeatability and stability of the plasma processing almost entirely depends on the repeatability and stability of the plasma. Thus it was many times proven that poor uniformity and repeatability of the film thickness in the CVD process as well as overetching or underetching in the etching process are a consequence of poor reproduction of the plasma.

Plasma processing systems act as dynamic non-linear loads with a wide range of magnitude and phase, depending upon the type of chamber and plasma process, gas type and pressure, temperature, and other variables. Because of mismatched loads and reflected power, the performance of transistors in power amplifiers (PA) of RF generators feeding plasma processing systems changes, thereby resulting in RF current and power dissipation stress for some loads and overvoltage stress for other loads. In some instances, depending upon the output power of the RF generator and the severity of transient mismatch presented by the load, voltages across transistors ($V_{ds}$) in the PA can exceed nine times their operating DC supply voltage and exceed 150% of the transistor breakdown voltage $V_{dss}$. This stress drastically reduces the reliability of the entire plasma processing system.

In the past few years there has been a trend among RF power amplifier designers to use high voltage switch-mode MOSFET transistors instead of low voltage RF MOSFET or bipolar transistors. This has been described, for example, in U.S. Pat. No. 5,726,603, which is hereby incorporated by reference in its entirety.

RF power amplifiers utilizing high voltage switch-mode MOSFET transistors have operating DC voltages (e.g., B+ drain voltages $V_{ds}$ between 100 and 175 V) and have employed high voltage switch-mode MOSFETs with breakdown voltages $Vd_{ss}$ up to a 1000 V in a standard TO-247 package. The large associated RF breakdown voltage margins permit sustained operation near open circuit load mismatches, as may be required by the severe requirements of an RF plasma processing load. Unfortunately, because the internal capacitances $C_{ISS}$, $C_{RSS}$ and $C_{OSS}$ of these transistors are all high, thereby affecting overall source and load impedances and performance at high frequencies, these transistors cannot be used in VHF generators. As a result, known VHF generators still utilize traditional RF devices with low operating voltages close to 50 V and breakdown voltages less than 150 V. Because of the relatively low (factor of three) breakdown voltage margins, VHF generators are extremely sensitive to overvoltage stress from VSWR transients. Therefore, special steps are required to ensure the stability and reliability of a VHF generator utilized in a plasma processing system.

Load mismatch protection loops can be incorporated in RF generators to decrease component stress. For example, loops can be employed to control maximum power dissipation, maximum DC and/or AC currents, maximum voltage across output transistors, maximum forward output power depending on the load VSWR identification, and so forth. However, the speed of these loops may not be sufficient to prevent a failure due to transient mismatches, such as arcs in a plasma chamber, because multiple protection loops having complex requirements and/or algorithms may be required. Moreover, although limiting the output power of the generator depending on the load VSWR may protect the generator for some load phases where the stress for the components poses a threat to the integrity of the whole system, this protection substantially decreases the generator's output power capability in all other phases. As a result, the ignition, sustaining and plasma processing capabilities of the entire system are reduced. Furthermore, incorporation of these protection loops is costly and may result in reduced reliability due to the added parts and complexity. Because both forward power output and efficiency degrade with increasing load mismatch power reflection, transistor power dissipation and die temperature increase. It has thus become a standard procedure to derate the output power of RF generators for the worst case phase of mismatched plasma loads in accordance with Table 1. A plot of typical deration is presented on FIG. 1.

TABLE 1

Worst Phase Forward Power Output vs. Load Mismatch Magnitude

| Load Mismatch Magnitude | | Worst Phase Forward Power |
|---|---|---|
| VSWR | Power Reflection | Power Output, W |
| 1.0 | 0.0% | 2500 |
| 1.5 | 4.0% | 2250 |
| 2.0 | 11.1% | 1800 |
| 3.0 | 25.0% | 1350 |
| 5.0 | 44.4% | 1250 |

TABLE 1-continued

Worst Phase Forward Power Output vs. Load Mismatch Magnitude

| Load Mismatch Magnitude | | Worst Phase Forward Power |
|---|---|---|
| VSWR | Power Reflection | Power Output, W |
| 10.0 | 66.9% | 1000 |
| 30.0 | 87.5% | 750 |
| ∞ | 100% | 500 |

In some plasma processing systems, preselected cable lengths must be used to decrease undesirable interactions between the RF generator and the non-linear plasma chamber loads, thus leading to cable sensitivity issues. Without the use of a preselected cable length, the plasma processing system may reach a maximum current or power limit for some plasma loads or may not be capable of producing the necessary output power for other loads. In either case, the RF generator will be overstressed, and its reliability and lifetime will be adversely affected.

Variations in the plasma load require continuous monitoring of plasma load conditions and adjustments in response to them to provide a reliable efficient transfer of RF power from the RF generator to the load of plasma chamber by matching their widely different impedances. For optimum power transfer without reflection, the output impedance of the RF generator ($Z_{gen}$), input and output impedances of the matching network ($Z_{match\ in}$, $Z_{match\ out}$) and input impedance of the chamber ($Z_{cham}$) must satisfy the following conditions: $Z_{gen}=Z_{match\ in}$; $Z_{match\ out}=Z_{cham}$. A variable matching network can be placed in series between the RF generator and the mismatched plasma load to satisfy these conditions.

Known matching networks usually comprise at least two variable reactive components arranged into L, Pi or T-network. At a fixed frequency and proper adjusted values the matching network presents a 50-Ohm load to the RF generator and a conjugate matched impedance to the plasma load. As such, the matching network transfers substantially all power from the generator to the load. Little power is dissipated in the matching network since the matching network uses only reactive components. However, this approach suffers from a number of problems which impact the precision, responsiveness and repeatability of plasma match, including, but not limited to low reliability usual for electromechanical apparatus with moving parts such as motors and variable capacitors; long delays in reaching tuning points; "lost" conditions in which the tuning elements do not seek the tuning point or drive away from it; and high power loss. Recently developed solid-state tuners still have low reliability when used in a "hot switching" mode under high power.

Other techniques have been used to prevent undesirable interaction between stages of plasma processing systems that may result in parasitic oscillations. These include the use of matching L-C sections, harmonic and subharmonic filters, duplexers, etc. However, even these techniques may not guarantee success because of the severe non-linearity of the load and reacted overstress of the components.

In some known designs, a mismatch between stages, such as between a driver stage and PA stage is intentionally increased, which may decrease parasitic oscillations in a narrow frequency range. Usually, this very inefficient method is used as a last resort. Other techniques that could be used include increasing negative feedback in the PA stages and/or decreasing their power gain. However, these other techniques may result in decreased bandwidth, increased power output in the driver stage, extra losses in the feedback network and decreased efficiency and reliability of the whole system. Techniques for dealing with these issues have not been addressed in known prior art VHF plasma processing systems, even through the problems presented are by no means trivial.

SUMMARY OF THE INVENTION

In one aspect of the present invention, there is therefore provided a radio frequency (RF) generator apparatus for a plasma processing system that is resistant to nonlinear load mismatch conditions. The apparatus includes an RF oscillator configured to generate an RF signal, an amplifier responsive to the RF signal to produce a VHF RF signal having sufficient power to drive a plasma chamber load, and a VHF-band circulator coupled to the amplifier and configured to isolate nonlinearities of the plasma chamber load from the amplifier.

In another aspect, there is provided a plasma processing system that includes a plasma chamber, and a radio frequency (RF) generator apparatus operatively coupled to the plasma chamber to supply RF power thereto at a VHF frequency. The RF generator apparatus includes an amplifier configured to produce the RF power supplied to the RF generator and a VHF-band circulator having an output configured to supply the RF power to the plasma chamber and configured to isolate nonlinearities of the plasma chamber from the amplifier.

In yet another aspect, there is provided a method for providing RF power at a VHF frequency to a non-linear plasma chamber load. The method includes generating VHF RF power in an RF generator output stage; passing the VHF RF power through a VHF-band circulator; and applying the VHF RF power passed through the VHF band circulator to a plasma chamber load.

Configurations of the present invention provide high power RF VHF generators and plasma processing systems with increased stability and reliability, even when significant load mismatches occur.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

The following description of the preferred embodiment(s) is merely exemplary in nature and is in no way intended to limit the invention, its application, or uses.

Figure 1:
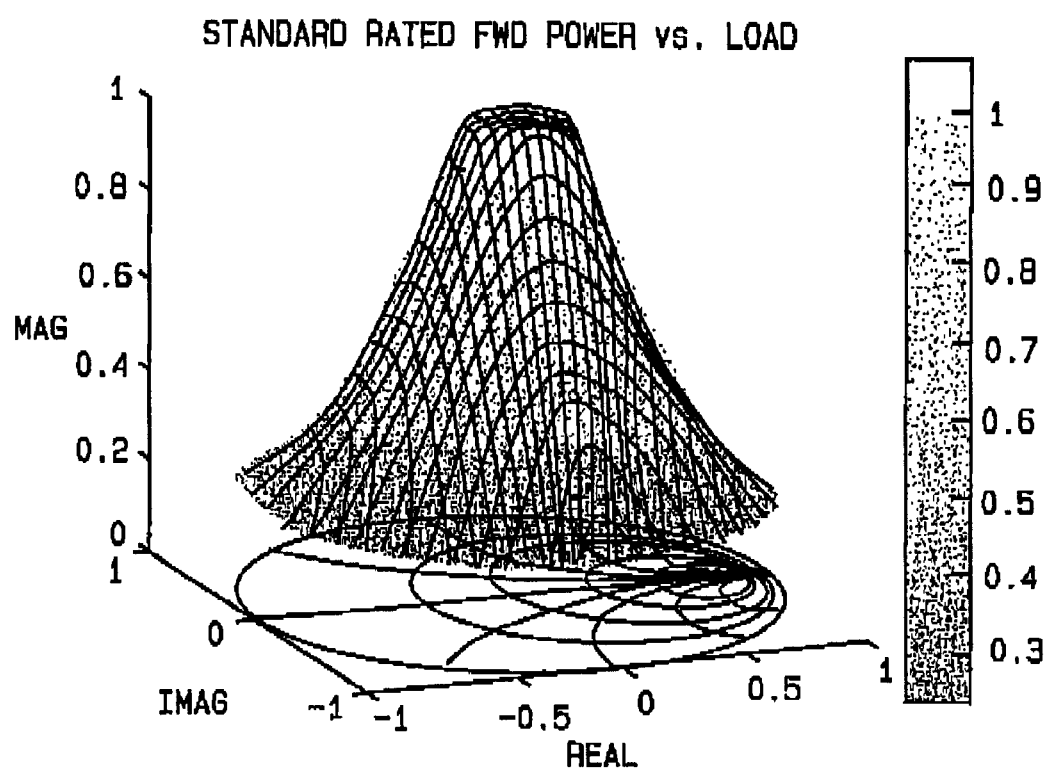
FIG. 1, is a plot of a typical deration of the forward power output of a radio frequency (RF) generator due to the temperature of the generator's power amplifier (PA) transistor.
Figure 2:
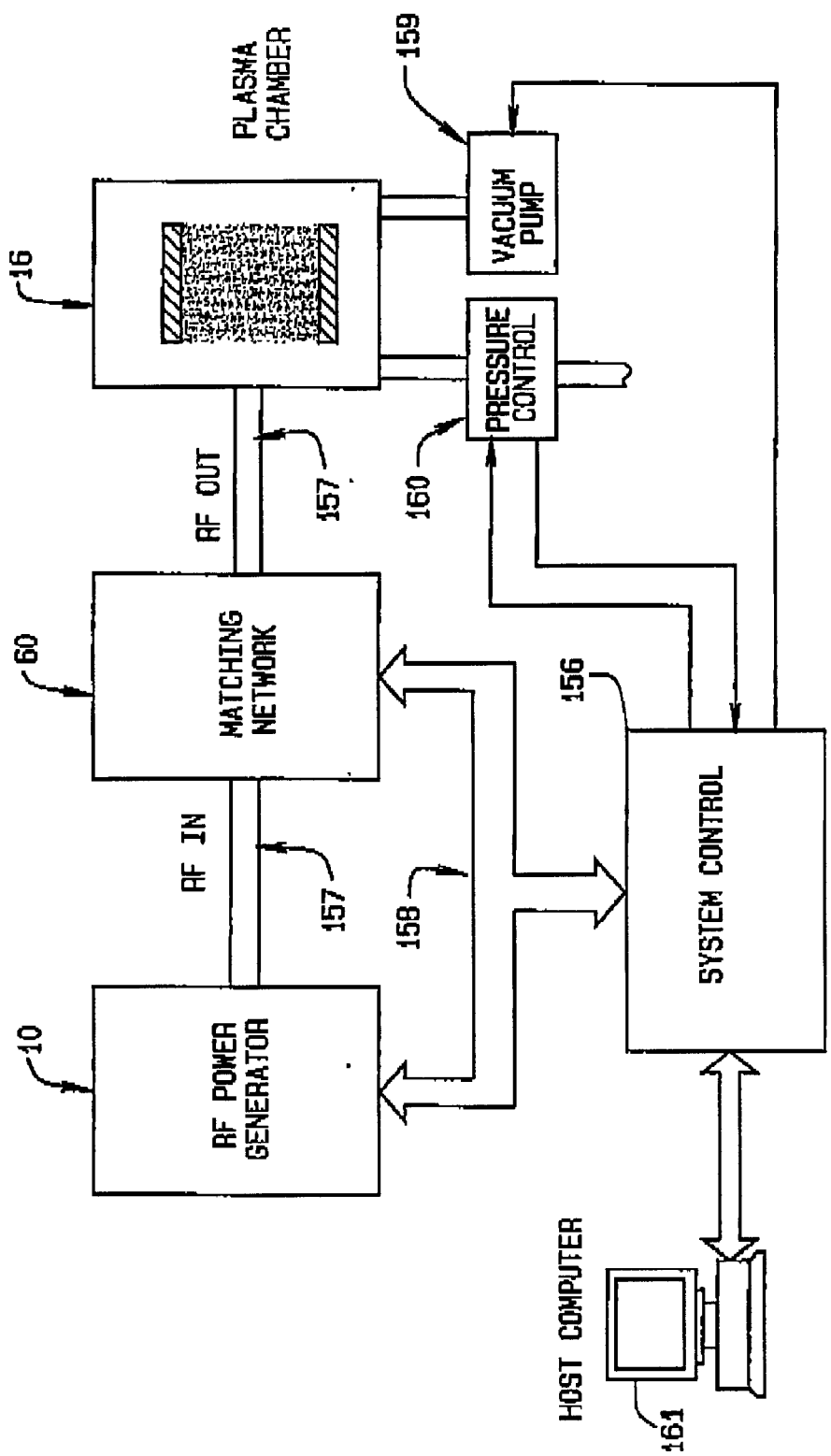
FIG. 2 is a block diagram of a plasma processing system.

In one configuration and referring to FIG. 2, a VHF plasma processing system comprises an RF generator 10 providing VHF energy to create and sustain plasma; a matching network 60 transferring RF power from the generator to the plasma reactor with minimum losses by matching their impedances; a plasma chamber 16 (which, in one configuration, is a glass box filled with an inert gas where the high-energy environment for chip fabrication is created); a system control 156 configured to automate the fabrication process by analyzing data from different sensors and providing precision adjustment of the plasma parameters. RF power cables 157 are used as coupling between the above-mentioned components, while BUS 158 provides communication between them. In one configuration, the VHF plasma processing system also includes auxiliary equipments such as a vacuum conduit associated with a vacuum pump 159, pressure control instruments 160, host computer 161, and so forth.

Figure 3A:
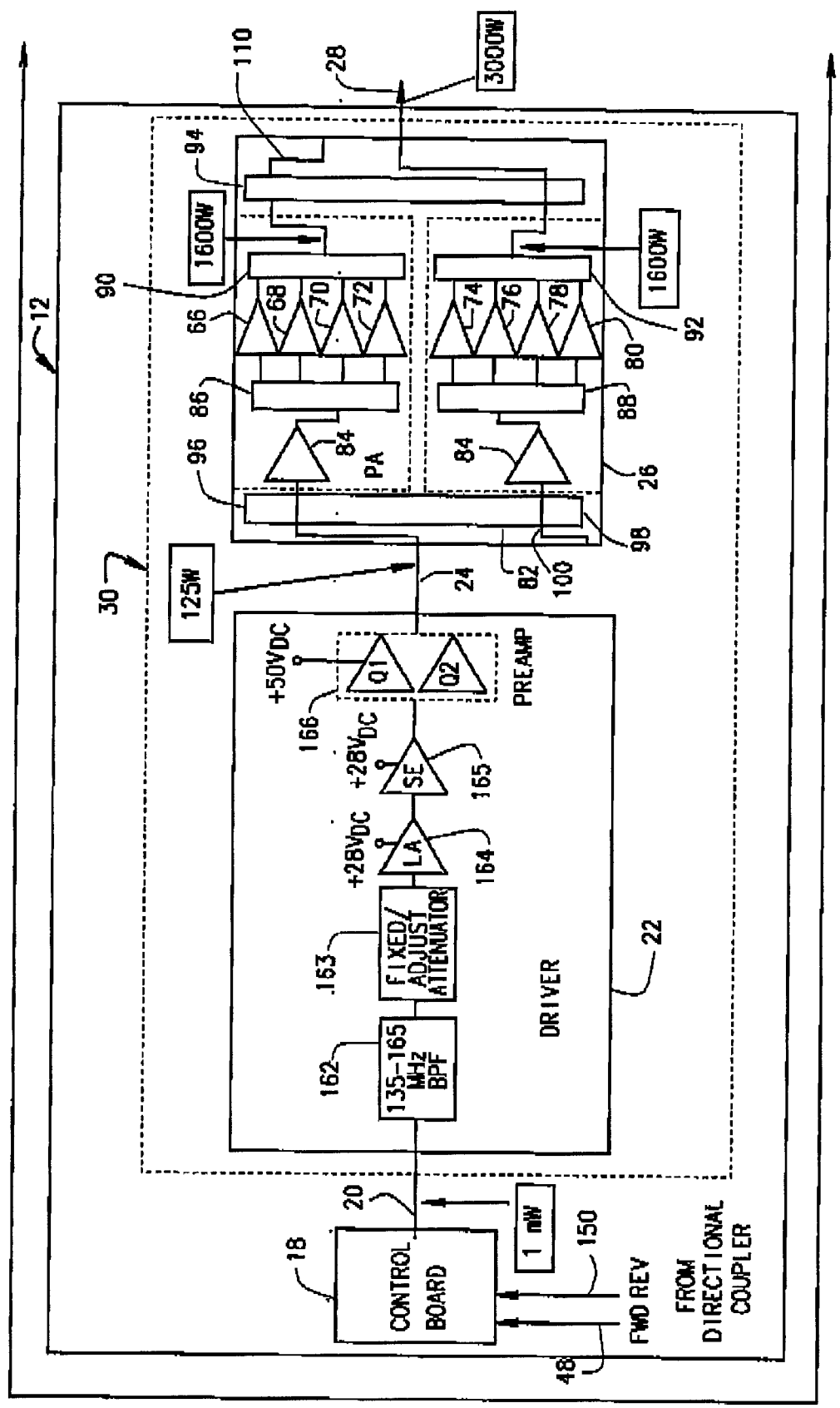
FIG. 3 is a block diagram of one embodiment of a radio frequency (RF) generator apparatus for a plasma processing system resistant to nonlinear load mismatch conditions.
Figure 3B:
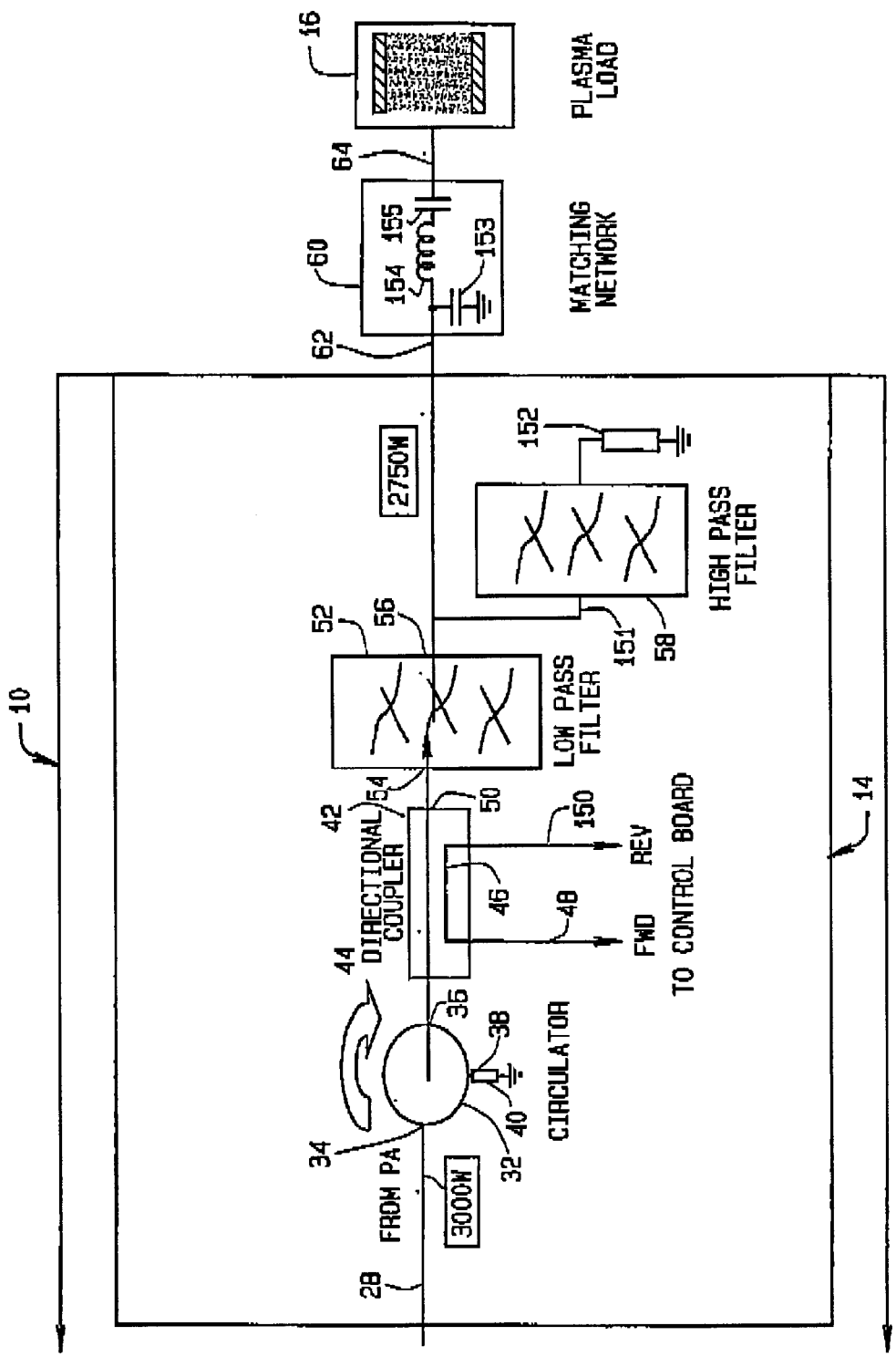

In one configuration and referring to FIG. 3, a radio frequency (RF) generator apparatus 10 in one configuration includes a control and amplifier portion 12 and an isolation portion 14. RF generator apparatus 10 provides RF power for a plasma load 16. Control and amplifier portion 12 comprises a control board 18 that is configured to generate a low level RF signal 20. For example, control board 18 comprises a direct digital synthesis circuit (not shown) that generates a low level VHF signal 20 of about 1 mW.

In driver stage 22, variable level input RF signal 20 is fed from control board 18 through a band-pass filter (BPF) 162 having a +/−10% bandwidth. BPF 162 thus reduces or eliminates harmonics and subharmonics and thereby minimizes harmonic distortion. BPF 162 is coupled to a series combination of fixed and adjustable attenuators 163. Attenuators 163 provide a match between the input impedance of linear amplifier 164 and the output impedance of BPF 162. Attenuators 163 also adjust the gain of driver 22 by changing the amplitude of the RF signal to linear amplifier 164, thus adjusting the output level of amplifier 164.

In one configuration, linear amplifier 164 is a CA2832 wideband, class "A" hybrid amplifier with 35 dB gain and maximum output power of 1.6 W. Hybrid amplifier 164 is coupled to a single ended RF amplifier circuit 165 configured for class "A" operation followed by a class "AB" push-pull preliminary amplifier (PreAMP) 166. PreAMP 166 produces a VHF drive signal 24 of about 125 W, which is sufficient to drive power amplifier (PA) stage 26. Intermediate level signal 24 is further amplified by PA stage 26 to generate an RF power output 28 at a power of, for example, about 3,000 watts. Thus, driver stage 22 and amplifier stage 26 together form an RF amplifier 30 that provides an RF power output 28 having sufficient power to drive plasma chamber load 16.

In one configuration, an isolation portion 14 comprises a VHF-band circulator 32 that is coupled to amplifier 30 and is configured to isolate nonlinearities of plasma chamber load 16 from RF amplifier 30. In one configuration, circulator 32 is a passive, non-reciprocal (one-way) ferrite device providing transmission of RF energy from one port 34 to an adjacent port 36 while decoupling energy from other ports in the reverse direction. A third port 38 of circulator 32 is coupled to ground via a termination resistor 40.

As discussed above, the stability and reliability of a plasma processing system almost entirely depends on the stability and reliability of the plasma. The stability of the plasma depends heavily on the stability and reliability of the generator, which in its turn greatly depends on the plasma load VSWR. Circulator 32 drastically decreases the input VSWR of the load. The finite input VSWR of the plasma load 16 and circulator 32 depends on several factors, including load 16 VSWR, the isolation of circulator 32 and the VSWR of circulator 32. The isolation (or return loss) of circulator 32 depends on the matching VSWR of termination port 38. Because of the relatively high system output power of 2500 W, two RFP-800 watt flange resistors are used in one configuration as termination resistance 40. To insure the stability of the plasma processing system, a well-matched termination for the circulator is provided in one configuration. However, because of the VHF application, a series inductor is added to each resistor lead in one configuration to cancel the relatively high parasitic distributed shunt capacitance of about 18 pF for each of the flange resistors.

Figure 4:
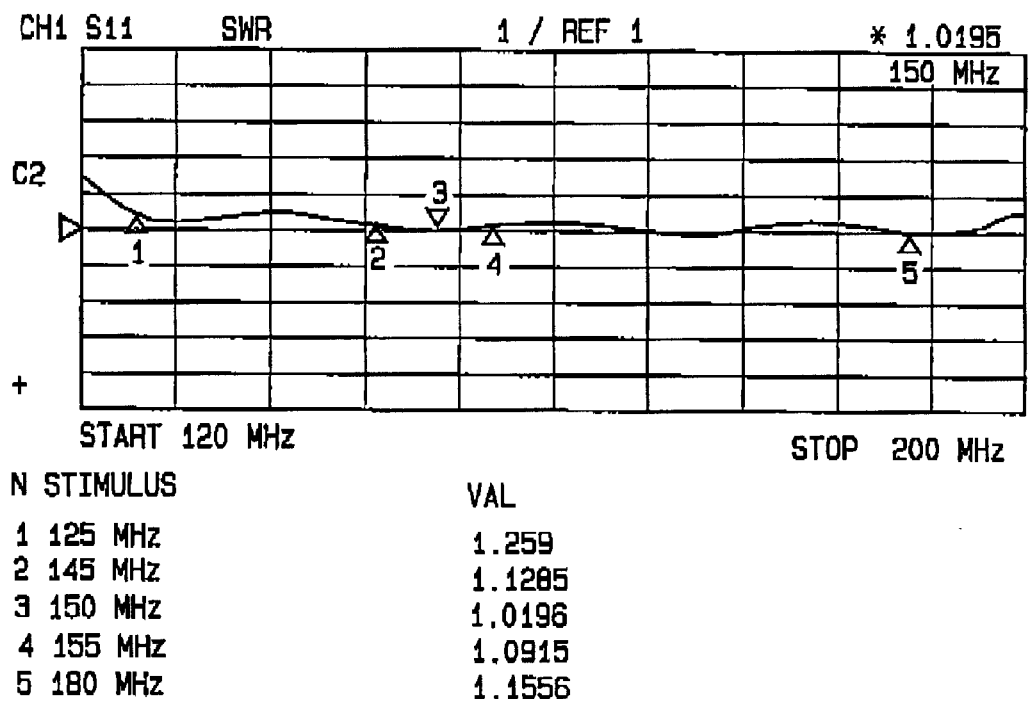
FIG. 4 is a plot of input VSWR of a circulator with match termination.
Figure 5:
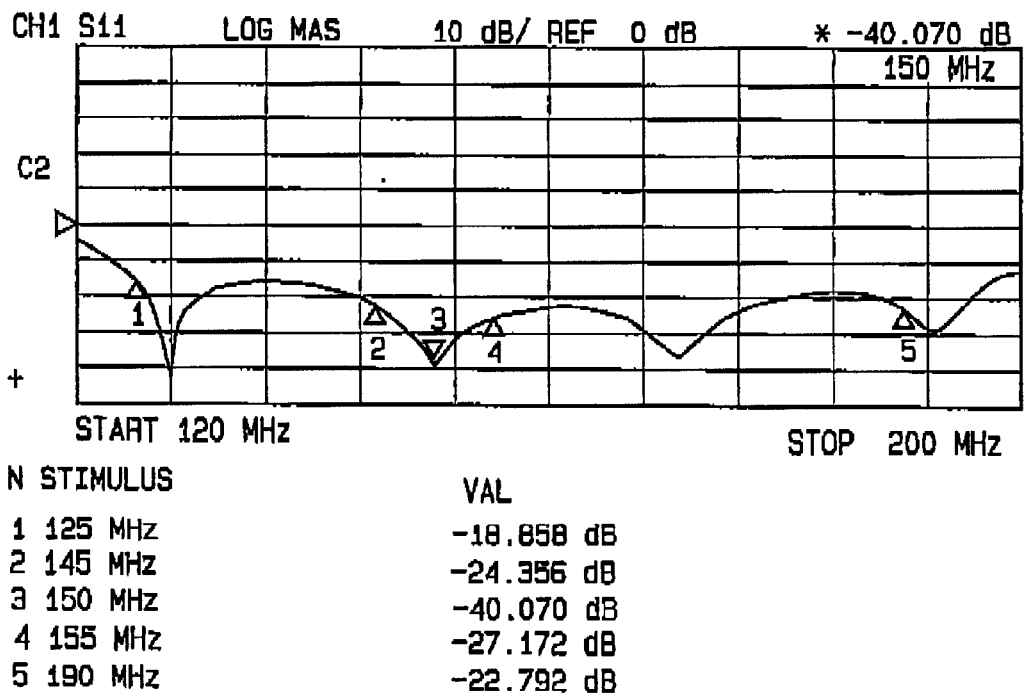
FIG. 5 is another plot of return loss of a circulator with match termination.
Figure 6:
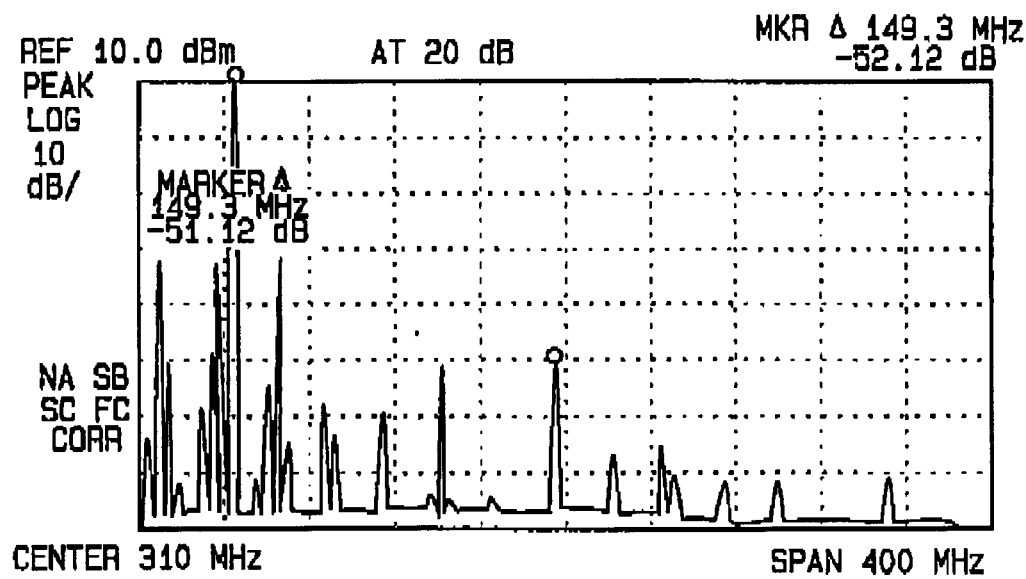
FIG. 6 is a plot of harmonics and spurious products in a plasma processing system that does not include a circulator.

The input VSWR and the return loss of circulator 32 (with matched termination 40) into an open load are shown in FIGS. 4 and 5, respectively. It will be recognized by one skilled in the art that the graphs of FIGS. 4 and 5 each include a table which lists the frequency and the value corresponding to that particular frequency for each of points 1, 2, 3, 4, and 5 shown on the respective graph above each table. This situation represents the very high impedance of plasma load 16 in the pre-ignition stage. Circulator 32 provides a low 1.13 VSWR (or better than 24 dB of return loss) in the passband and more than sufficient broadband application to significantly improve the stability of the plasma processing system of the present invention. The improved stability is indicated by plots shown in FIGS. 6 and 7. FIG. 6 is a plot of the harmonics and spurious products of the described above plasma processing system taken from the Forward port of the Directional coupler 46, but without circular coupler 32 in the system. RF generator 10 was connected via 4' RF cable RFG-393 directly to matching network 60, which was tuned to a 2.3-j47 Ohm load. Even though matching network 60 presented generator 10 with a 50 Ohm load at the fundamental frequency of 150 MHz and thus should also function to filter out other frequencies, spurious signals were detected at the output of generator 10. On many occasions, the spurious signals passed through low-pass filter 52 and power sensor 42, and reached driver 22, PA 26 or control board 18, causing interference and inconsistent tuning, abnormal output and/or reflected power and poor water repeatability. In cases in which instability was substantial, it resulted in transistor failures in various stages of the system.

Figure 7:
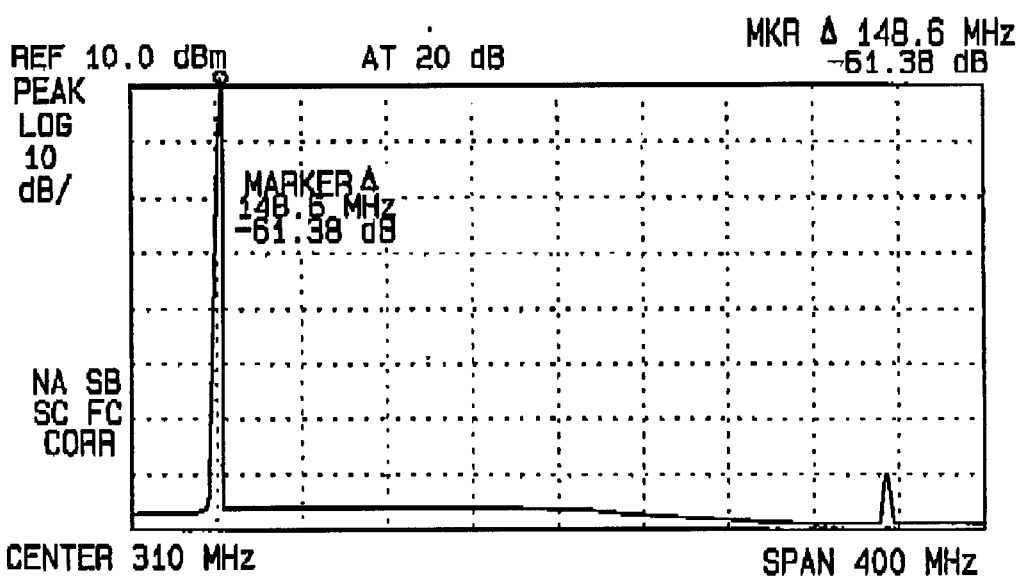
FIG. 7 is a plot of harmonics and spurious products in a plasma processing system that does include a circulator.

FIG. 7 is a plot of the same system taken at the same point with a CX1R3 circulator 32 installed between PA 26 and directional coupler 42. The length of the cable between the generator 10 and matching network 60 was increased in 1-inch increments to create 12 test points around the Smith Chart. For each cable length the harmonics/spurious products was found to be substantially similar to FIG. 7. In this arrangement, the level of the harmonics is below −60 dBc, which is less than 0.0001% of the output power. This confirms that the plasma processing system utilizing circulator 32 is stable, with substantially reduced or eliminated spurious signals, and is essentially insensitive to cable length changes.

A suitable high-power circulator 32 is type CX1R3, available from Sonoma Scientific, Inc. The CX1R3 is a Y-junction circulator that utilizes high power ferrite materials and above-resonance strip-transmission line matching networks to provide low insertion loss without non-linear effects in a small package. This circulator can handle an output power of more than 3 kW within a frequency range of about 145 to 155 MHz, while providing a minimum isolation of 22 dB. The maximum insertion loss is 0.3 dB, and the maximum input VSWR is 1.18:1.

When the output port of the circulator is open or shorted, almost all incident power is reflected back and dissipated as heat in termination resistor 40. Therefore, the power rating of resistor 40 should be at least equal to the maximum rated forward power of the system, unless the rated reverse power level is limited by the protection circuitry of the generator. The rated reverse power limit for the CX1R3 circulator is 1 kW CW or full power of 3 kW CW for 1 minute. Thus, two 800 W resistors placed on a water-cooled heat sink provides a reliable termination. These ratings are sufficient to protect the generator from load VSWRs instabilities during normal plasma processing, as well as to provide enough time for control protections to take over in the unexpected case of a full 2500 W of reflected power. The XC1R3 circulator is 12.7 cm×13.46 cm×3.05 cm (5 in×5.3 in×1.2 in), which is compact enough for mounting in a small chassis.

In one configuration, dual directional coupler 42 is inserted between the circulator 32 and low pass filter 52 to allow precise monitoring of RF energy flow while introducing minimum distortion to the main signal. Coupler 42 includes a sensor 46, which provides samples 48 and 150 for forward and reverse power, respectively, with high directivity and low through loss. An RF signal 36 is applied to input port 44 and then split unequally, depending on the coupling factor, between main line output port 50 and forward port 48.

Directional coupler 42 is configured to handle 5 kW of VHF power with less than 0.03 dB insertion loss, 43 dB forward coupling and greater than 40 dB directivity. In one configuration, forward sample 48 and reverse sample 150 sample couplings include build-in band pass filter (BPF) networks (not shown in FIG. 3) with +/−10% bandwidth, +/−0.02 dB ripple and greater than 25 dB rejection of harmonics. These BPFs improve overall power stability and reliability by preventing out-of-band harmonics and subharmonics created by plasma load non-linearities from reaching control board 18. Forward sample 48 and reverse sample 150 represent the plasma load VSWR, and are fed to control board 18 to adjust the gain and frequency of the RF source.

In this manner, the requested output power level is maintained and the sensed load VSWR is minimized.

Because plasma reactors impose a highly non-linear load, the sinusoidal waveform of the input power becomes distorted, producing out of band energy in form of harmonics and subharmonics. In one configuration, a harmonic network comprising a low-pass filter (LPF) 52 and a high-pass filter (HPF) 58 is interposed between directional coupler 42 and matching network 60 to deal with out-of-band signals generated by the non-linearity of the plasma load. Output 50 of directional coupler 42 is coupled to input 54 of LPF 52, which output 56 is connected to an input 151 of HPF 58.

In one configuration, to maintain a harmonic content below −50 dBc over the entire dynamic range, LPF 52 is configured to provide a fifth order 0.01 dB passband ripple Chebychey response. Dissipative termination of harmonics is provided by HPF 58 connected to the output 56 of the LPF 52. In this arrangement, harmonics generated by the plasma load 16 are absorbed by termination 152 of HPF 58 without appreciable effect on the main VHF signal. In one configuration, HPF 58 has a fifth order 0.01 dB passband ripple Chebychev response.

It will be recognized that the combination of LPF 52 and HPF 58 forms a diplexer, which minimizes harmonic distortion and creates a dissipative harmonic termination. The total insertion loss of the diplexer in one configuration is less than 0.12 dB. Input and output impedances at 150 MHz are 50 Ohm with less than 1.1:1 VSWR. The output VSWR for the second and third harmonics are less than 1.5:1 and 3:1 accordingly.

The employment of the diplexer comprising LPF 52 and HPF 58 significantly decreases the amplitude of reverse signals coming back from plasma load 16 through matching network 60 and reaching RF generator 10. Moreover, harmonics generated by the plasma load 16 and traveling back towards generator 10, will be absorbed in termination resistor 152 of HPF 58 and not reflected back to matching network 60 and therefore, will not interfere with plasma load 16. Thus, plasma system performance is essentially independent of the cable length between RF generator 10 and matching network 60. This independence on cable length improves overall system stability and reliability over a wide range of mismatched load VSWR. Furthermore, the above-described arrangement of diplexer (LPF 52 and HPF 58), as well as its placement in the RF signal path after power sensor 42, inhibits harmonics from reaching power sensor 42, thus ensuring accuracy of reflected power measurements.

In one configuration, output 56 of LPF 52 is coupled to input 62 of a matching network 60. Output 64 of matching network 60 is connected to plasma load 16. Matching network 60 allows maximum power transfer at VHF from RF generator 10 to the plasma load 16 by transforming the impedance of load 16 to match the 50-Ohm impedance of generator 10. Because of the reliability advantages of automatic frequency tuning (AFT), a fixed matching network 60 topology is used to achieve this impedance transformation in one configuration of the plasma processing system. This topology is a basic "L" configuration with one shunt capacitor 153 and a series combination of an inductor 154 and a capacitor 155. AFT changes the frequency of the generator until it reaches an optimum frequency at which the plasma load is tuned to a minimum reflected power. There are no moving mechanical parts in this arrangement, so tuning is reliable and fast.

Shunt capacitor 153, referred to as a "Load" section, reduces the inductive component in plasma load 16. At the same time, inductor 154, referred to as a 'Tune' section, resonates the capacitive component of load 16. Under AFT and a fixed matching network arrangement, the frequency of generator 10 is automatically tuned until it reaches a frequency at which the plasma system is tuned, i.e., the input impedance 62 of matching network 60 matches the output impedance of generator 10; typically 50 Ohms. At the same time, the output impedance 64 of matching network 60 matches the impedance of plasma load 16 as closely as possible in accordance with the selected tuning algorithm. The decision as to when the optimum tuning point is reached may be based upon, for example, the ratio of the reflected and forward power, the reflection coefficient (the square root of the ratio of reflected and applied power), VSWR, or other suitable measurements, as described in U.S. Pat. No. 6,020,794, which is hereby incorporated by reference in its entirety.

In one configuration, taking into account losses in circulator 32, directional coupler 42, low pass filter 52, and matching network 60, at least 2.5 kilowatts of RF power are provided to load 16 at a nominal frequency of 150 MHz. More particularly, in one configuration, at least 2.5 kilowatts of output power are provided at an optimum frequency between 142 and 158 MHz depending upon instantaneous VSWR indicated by directional coupler 42. To generate this amount of power, power amplifier stage 26 comprises eight push-pull, class AB amplifiers 66, 68, 70, 72, 74, 76, 78 and 80 utilizing 300-watt double diffused MOSFET transistors. Transistors suitable for this application include SD2933 N-channel MOS field effect RF power transistors available from STMicroelectronics, N.V. Carrollton, Tex. The SD2933 transistors have maximum drain-source and drain-gate ratings of 125 V, a maximum drain current of 40 A, and a maximum power dissipation of 648 W.

Figure 8:
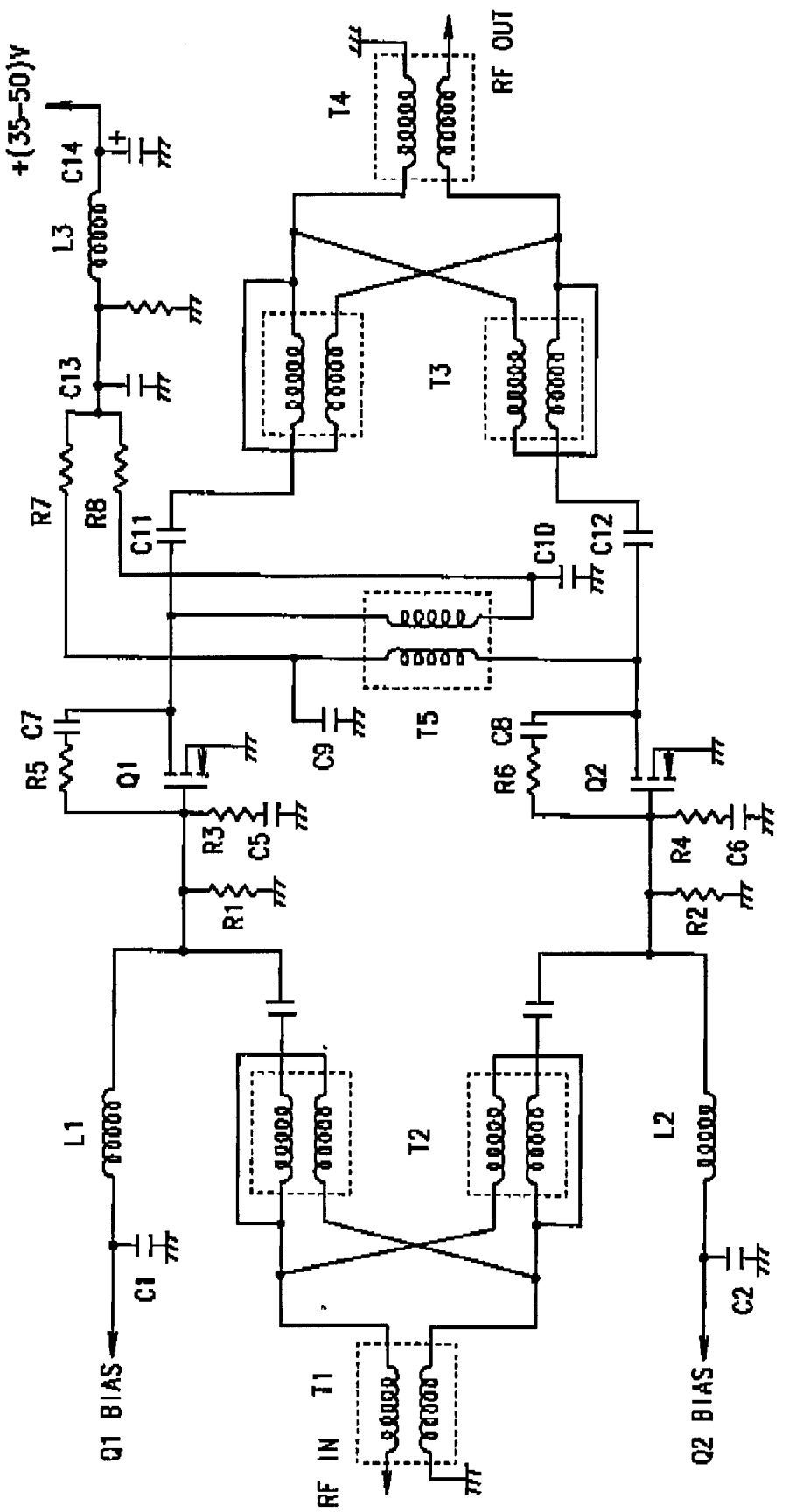
FIG. 8 is a schematic diagram of a VHF, class AB, push-pull amplifier.

One configuration of a push-pull amplifier suitable for use for each push-pull (PP) power amplifier 66, 68, 70, 72, 74, 76, 78, and 80 is represented schematically in FIG. 8. This amplifier employs a pair of MOSFETs Q1, Q2 connected in a push-pull configuration (i.e. 180 degrees out of phase) and biased in Class AB mode of operation. Each push-pull (PP) transistor Q1 and Q2 operates at a drain-to-source voltage of about 50 V over a 135 to 165 MHz frequency range with 9 dB power gain and less than 1 dB compression. Topologically, the amplifier configuration represented in FIG. 8 utilizes transformers to feed an input signal to transistors Q1, Q2 and to combine the resulting output signals. The "RF in" input drive signal is applied to a 50 Ohm input port of balun transformer T1. Balun transformer T1 has a characteristic impedance of 50 Ohm and splits the input drive signal equally into forward and reverse phases. The balun windings of T1 are mutually coupled, each having an output impedance of 25 Ohm to ground. The output of the balun transformer T1 feeds a 9:1 step-down balanced to balanced transformer T2, the low 5.5 Ohm impedance of which is connected to the gates of transistors Q1, Q2. A bias is applied to each MOSFET Q1 and Q1 by respective bias signals Q1 BIAS and Q2 BIAS.

At the output side of PP amplifier of FIG. 8, both forward and reverse phase waves are combined via an output 1:9 step-up balanced to balanced transformer T3. Transformer T3 has two balanced low impedance inputs of 2.78 Ohm to ground, one connected to the drain of Q1 and the other connected to the drain of Q2, separated by 180 degrees. Output ports of transformer T3 are coupled to the balanced inputs of balun transformer T4, which has a characteristic impedance of 50 Ohm and provides an unbalanced 50 Ohm output port for further combining of the output power.

In one configuration, transformers T1, T2, T3, and T4 are transmission type without ferrite cores, using an electrically short conductor printed on a planar dielectric substrate. Both Q1 and Q2 transistors have individual input RF terminations (R3, C5 and R4, C6, respectively) between gate and source. Each termination is made up as a series resistor-capacitor combination with the capacitor acting as a DC block. In one configuration, resistors R3 and R4 are each 50 Ohms to provide stable RF operation into high VSWRs without compromising power gain. Capacitors C5, C6 are 0.01 $\mu$F DC blocking caps. This value was selected so that gating rise and fall times would not be affected.

Each MOSFET Q1, Q2 also has its own DC termination resistor R1, R2, respectively, connected between gate and source. In one configuration, resistors R1 and R2 are each around 1 kOhm to insure DC stability in the event gating inputs are left unconnected or unterminated. Broadband RF stability into high output VSWR loads as well as input/output match is achieved using drain-to-gate RF feedback networks comprising a series resistor-capacitor combination (R5, C7 and R6, C8), with capacitors serving to block DC. In one configuration, resistors R5 and R6 are each 50 Ohm 50 W flange mount resistors to provide output stability into all phase conditions, including open and short, without significantly affecting power gain and output power capabilities.

In one configuration, a drain supply of 35–50 Volts is connected to each transistor's drain via DC feed circuitry comprising inductor L3 and capacitors C13 and C14 to prevent RF energy from the PP amplifier from entering the power supply and also to prevent switch-mode noise from the power supply from reaching the PP amplifier. This is accomplished with a large series inductor, i.e., choke L3 and a parallel pair of capacitors C13 and C14. Capacitor C13 is an RF bypass capacitor and an electrolytic capacitor C14 is a low frequency bypass cap. The feed circuitry also includes sensing resistors R7 and R8 to monitor transistors Q1, Q2 currents, a reversing transformer T5 and bypassing capacitors C9, C10. Capacitors C11, C12 serve as DC blocking capacitors. Each of the gates of transistors Q1 and Q2 are coupled through inductors L1, L2 respectively to a source of gate bias (not shown). Capacitors C1, C2 serve as RF bypass capacitors. Their values are selected to avoid affecting gating rise and fall times.

The PP circuitry configuration represented in FIG. 8 is optimized for output power, drain efficiency, compression, power gain over the desired VHF frequency range, without requiring any adjustments. The PP circuitry represented in FIG. 8 provides 500 W RF power at 135–165 MHz with about 55% drain efficiency. The power dissipation per transistor is approximately 205 W, resulting in about 85 deg C. die temperature rise above the heatsink.

All push-pull transistors Q1 and Q2 are mounted on a water-cooled heatsink, commonly referred as a cold plate, which is digitally controlled so that the temperature does not exceed 55 deg C. To ensure relatively high power dissipation, the SD 2933 transistors are used. This transistor has a maximum operating junction temperature of 200 deg C. and a thermally enhanced non-pedestal package having a thermal resistance of 0.27 degrees C/W. In one configuration, depending on the output power and load VSWR, control board 18 uses an agile rail algorithm to optimize the 35–50 V drain voltage so that the junction temperature of the devices never exceeds 140 deg C. This provides more than 40% margin and more than sufficient for reliable operation of the plasma system.

Referring again to FIG. 3, power amplifier stage 26 utilizes a first 90-degree hybrid 82 configured as a 2-way splitter to isolate driver stage 22 from an intermediate amplifier (IMA) 84 of power amplifier 26.

The 125 W output signal 24 from driver 22 is divided by 90-degree hybrid 82 into two signals to drive stages 96, 98 of IMA 84. IMA stages 96 and 98 are identical to the above-described PP 66, 68, 70, 72, 74, 76, 78, and 80 configurations as represented in FIG. 8 and used in PA 26. Thus, the same circuitry design is utilized for different applications, simplifying the design, production, and testing of the plasma system and improving its reliability. IMA 84 can provide a sufficient 3 dB power margin to drive PA 26.

The 90-degree hybrid 82 is a four port 50-Ohm network that splits an input signal into two equal output signals with 25 dB isolation while adding to one of the outputs a 90-degree phase shift with respect to the phase of the other output. The absolute phase value of each output port changes with frequency; however, the network maintains a constant 90-degree phase difference between outputs across the specified frequency range.

The quadrature-phased output signals of IMA stages 96, 98 are coupled to respective in-phase 4-Way splitters 86 and 88. In one configuration, each splitter 86 and 88 provides four in-phase 50 Ohm outputs, which are isolated with greater than 23 dB isolation and are fed to drive two sets of four push-pulls, the first comprising push-pulls 66, 68, 70, and 72, and the second comprising push-pulls 74, 76, 78, and 80.

The outputs of PPs 66, 68, 70, 72, 74, 76, 78, and 80 are applied to respective 50-Ohm inputs of two 4-Way in-phase combiners 90 and 92. In one configuration, combiners 90 and 92 provide input port-to-port isolation better than 23 dB. Each output port of combiners 90 and 92 produces a vector sum of four input signals while maintaining a 90-degree phase shift between output vectors. The quadrature-phased output signals of combiners 90 and 92, about 1600 W each, are recombined via a second 90-degree hybrid 94 to an output providing about 3 kW of VHF energy at 50-Ohm impedance port 28.

Both in-phase splitters 86, 88 and in-phase combiners 90, 92 utilize transmission type transformers using an electrically short conductor printed on a planar dielectric substrate similar to that described above for transformers in PPs 66, 68, 70, 72, 74, 76, 78, and 80. Second hybrid 94 is a high-power VHF wideband 90 degree hybrid configured as a two-way combiner to combine outputs from two 4-way combiners 90, 92 of power amplifier stage 26. One commercially available hybrid model that can be used for hybrids 82 and hybrid 94 is type 4418, available from Anaren Microwave, Inc. This hybrid is rated at an output power of 3 kW CW at frequencies between 130 and 170 MHz. The minimum isolation is 25 dB at a maximum insertion loss of 0.2 dB. The maximum VSWR of the hybrid is 1.15:1. An amplitude balance of +0.2 dB and a phase balance of +1.5 degrees are also provided.

In one configuration, to adjust the RF output frequency of generator apparatus 10, a high-frequency phase locked loop (PLL) synthesizer utilizing a voltage-controlled oscillator is provided on control board 18 in place of a direct digital synthesizer. A frequency synthesizer is a network that stablizes the frequency of a free-running oscillator against a stable reference, typically a crystal oscillator, and using the result to control the tuning.

Figure 9:
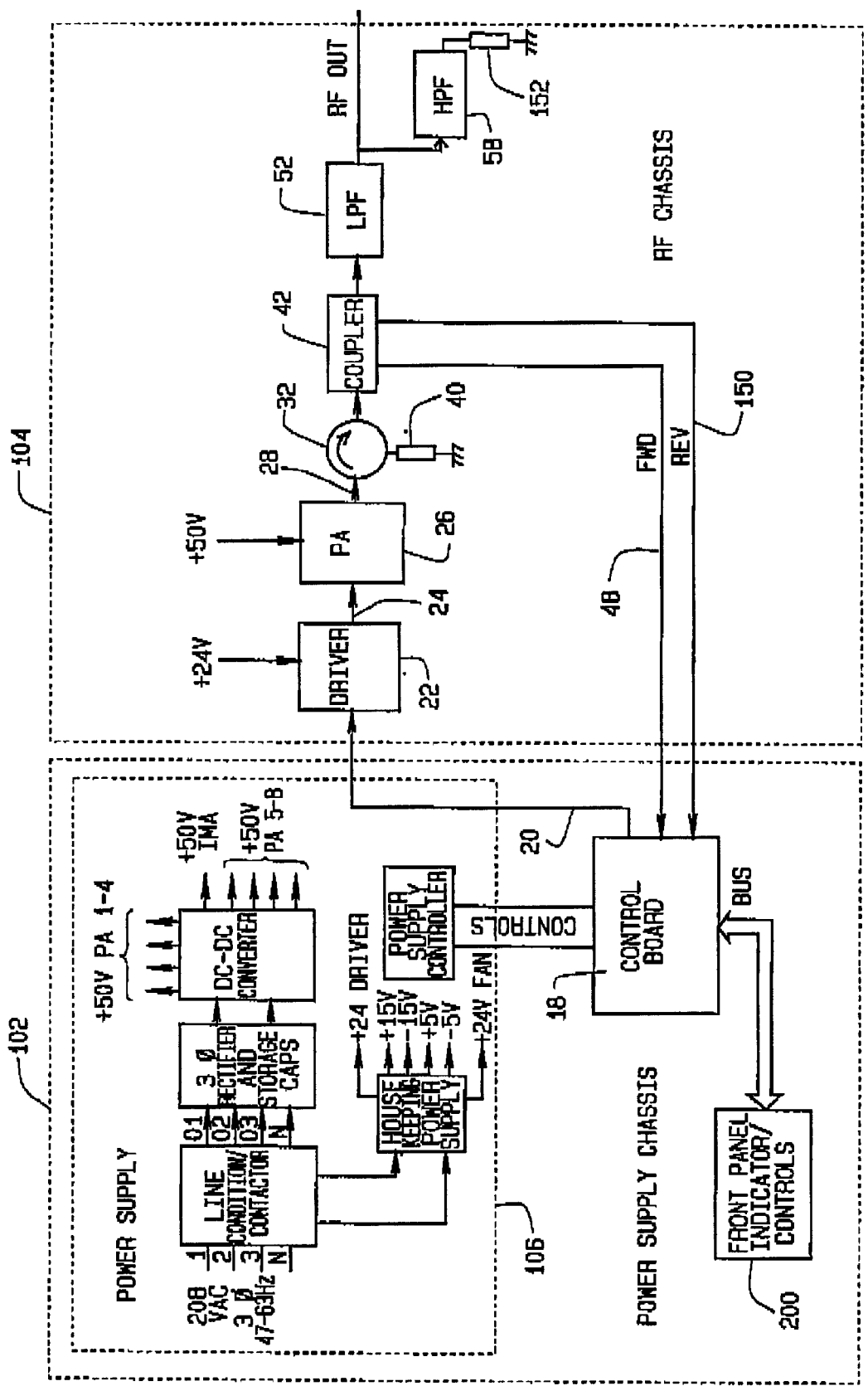
FIG. 9 is a representation of the embodiment of FIG. 3 housed in two interconnected chassis.

In one cofiguration and reffering to FIG. 9, Rf generator apparatus is housed in two separate chassis 102, 104. Chassis 102 includes a 10 kWV switch-mode power supply 106, which provides all DC voltages for RF driver stage 22 and power amplifier stage 26. Control board 18 and front panel indicator/controls 200 are also housed in chassis 102. Chassis 104 houses the entire RF section, specifically, driver stage 22 and power amplifier stage 26, including its eight push-pull power amplifiers 66, 68, 70, 72, 74, 76, 78, and 80, hybrid couplers 82 and 94 and other ancillary components not shown separately in FIG. 9. These push-pull power ampilfiers are mounted on one side of a water-cooled heatsink (not shown). The other side of the heatsink is used for driver 22, splitters 86 and 88, combiners 90 and 92, 90 degree hybrid couplers 82 and 94, circulator 32, directional coupler 42, and filters 52 and 58.

Figure 10:
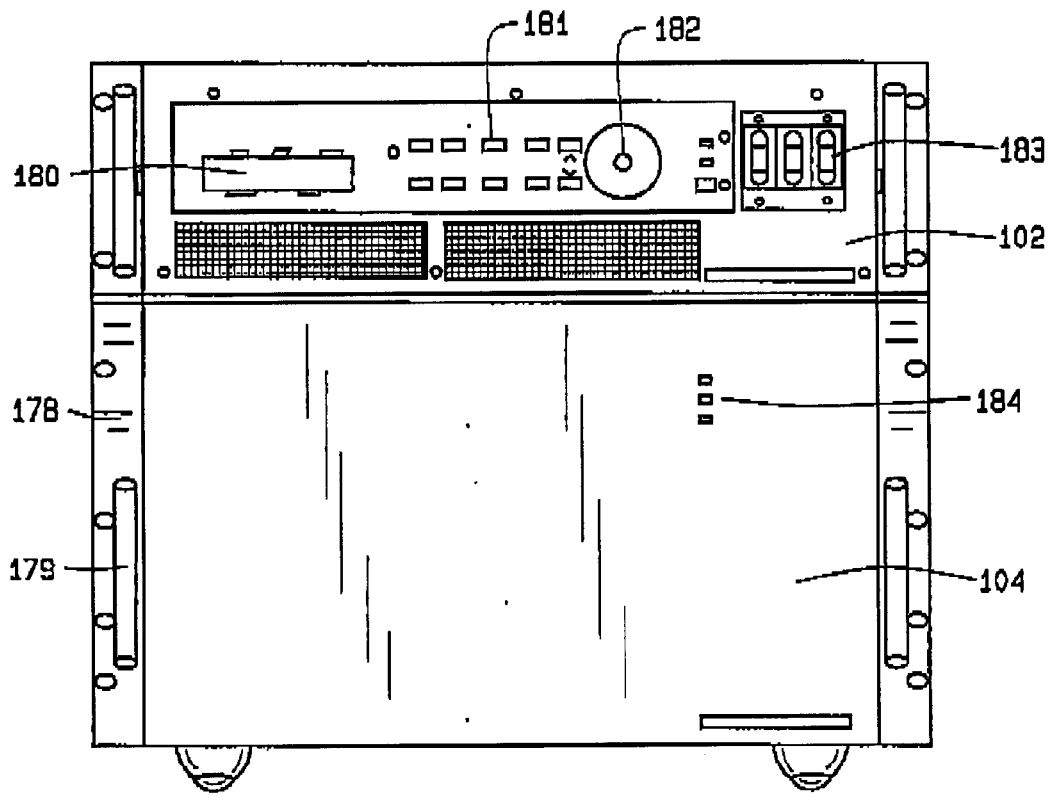
FIG. 10 is a representation of the front panels of one configuration of an interconnected power supply chassis and RF chassis.
Figure 11:
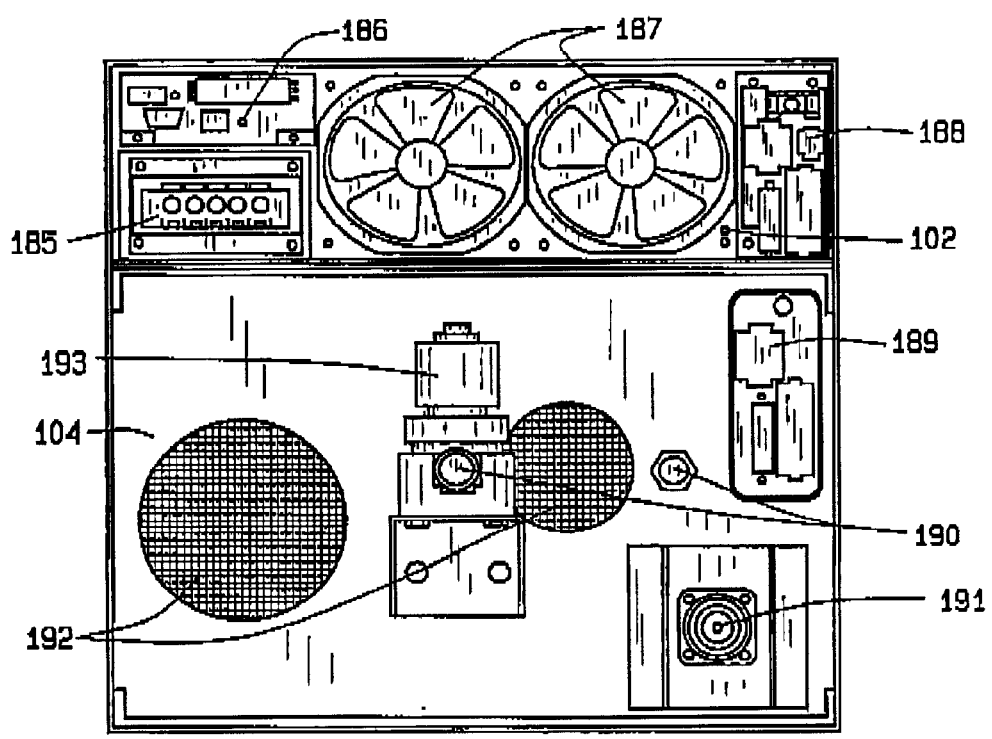
FIG. 11 is a representation of the rear panels of one configuration of an interconnected power supply chassis and RF chassis.

FIGS. 10 and 11 are drawings of the front and rear panel assemblies of the described combined two chassis configuration, respectively. The front panel of the power supply chassis 102 includes following controls (FIG. 10):

Display 180 with two lines of 20 characters;

ON/OFF and menu buttons 181;

Digitizer knob 182 to select certain values in the menu option; and

Circuit breaker 183.

The front panel of the RF chassis 104 contains (FIG. 10) AC and RF ON/OFF and fault status indicators 184.

Chassis 102 and 104 are connected using brackets 178 with handles 179 to install the generator into a standard 19" rack.

The rear panel of the power supply chassis 102 includes the following components (FIG. 11):

AC input connector 185;

Digital and analog interface connectors 186 to control and monitor the status of the generator;

Cooling fans 187; and

DC and RF lines connectors 188 from the power supply chassis 102 to the RF chassis 104.

The rear panel of the RF chassis 104 includes following components (FIG. 11):

DC and RF lines connectors 189 from the RF chassis 104 to the power supply chassis 102;

Water cooled heatsink connectors 190;

RF output connector 191;

Cooling fans 192; and

Solenoid valve 193.

The two-chassis configuration has a number of advantages compared with a one chassis configuration. Depending on the system's requirements for output power, efficiency, frequency range, etc., a power supply in a separate chassis could be easily introduced into any particular system while all necessary changes are implemented mainly in the RF chassis. For manufacturing, it is convenient to have one common power supply chassis, which is easy to assemble and test separately and which then can be used in a variety of RF systems.

By incorporating circulator 32 between an output stage of power amplifier 26 and plasma load 16, high power VHF plasma systems such as those utilized in the semiconductor industry can be powered by a high-power RF generator apparatus. Circulator 32 provides isolation and suppression of reflected power caused by interactive plasma impedances that would otherwise degrade stability and reliability of the entire generator/plasma load system. In addition, circulator 32 allows RF generator apparatus 10 to operate nominally without any changes in performance parameters, irrespective of the condition of the plasma load, the cable lengths between RF generator apparatus 10 and load 16, or any load mismatch. RF generator apparatus is thus able to operate into considerable load mismatches, including open-circuited and short-circuited loads. As a result, significant improvements in stability and reliability are achieved.

A reliability improvement is provided by the incorporation of low-loss transformers as described above into all IMA 84 and PA 26 push-pull stages, as well as into in-phase splitters 86, 88 and in-phase combiners 90, 92. Among other advantages, these no-ferrite, transformers provide very low 0.1–0.15 dB insertion loss because the conductors are physically similar, do not surround each other and do not experience differential heating. At the same time, they also ensure RF transformation without undesirable phase lag between conductors because, unlike coaxial cable conductors, they have almost identical dimensions.

All transformers are designed as transmission type using an electrically short conductor printed on a planar dielectric substrate. Construction and repeatability of each transformer configuration is simplified because they are easily replicated as printed circuits mounted perpendicular to a surface of another planar RF circuit board having a plurality of electrical contacts, as it is discussed in greater detail in copending application Ser. No. 10/080,252, filed Feb. 21, 2002, which is hereby incorporated in its entirety by reference.

The use of low-loss transformers in power amplifier stage 26 together with thermally-enhanced high-power transistors enable each push-pull amplifier 66, 68, 70, 72, 74, 76, 78 and 80 to produce 500 W of power at VHF frequencies. The low thermal resistance increases the safe operating area of the transistors. Thus, eight power amplifier push-pull amplifiers are sufficient to generate the required amount of RF power output, rather than the sixteen that have been required in previous designs. The reduction in the number of components also contributes to improved reliability and stability.

Even though phase splitters/combiners are cheaper and easier to design and implement, there are advantages in utilizing a combination of in-phase splitters/combiners and 90-degree hybrids for improving stability and reliability of a plasma processing system. One such advantage is that an output 90-degree hybrid 94, unlike an in-phase 2-Way combiner, does not transfer a load mismatch at the output sum port 28 back to all input ports at the same phase and equally divided amplitude. Because of this, the reflected load mismatch will present upper PA 26 section (PP 66, 68, 70, and 72) and lower PA 26 section (PP 74, 76, 78, and 80) with loads shifted by 90-degree. As a result of this, each section will see a different mismatch, thus drastically decreasing the possibility for system oscillation. On the other hand, the reflected power, caused by mismatched load VSWR flowing back into the output port 28 of the output 90-degree hybrid 94, will split at its inputs and then partially reflect back, thus canceling at the output port 28 and adding across the termination resistor 110.

The result is that the combined PA output 28 behaves as though it has a matched source impedance, considerably improving system stability.

Moreover, the input 90-degree splitter 82, unlike an in-phase 2-Way splitter, does not reflect the mismatch of the IMA stages 96, 98 back to the driver 22. When hybrid 82 is coupled into similar mismatches of stages 96, 98, it routes the reflected power away from the driver 22 directing it into termination port 100, thus isolating the driver 22 from VSWR ripple and instability. This presents driver 22 with 50-Ohm impedance regardless of the mismatch at IMA stages 96, 98 increasing the overall stability and reliability of the system.

Figure 12:
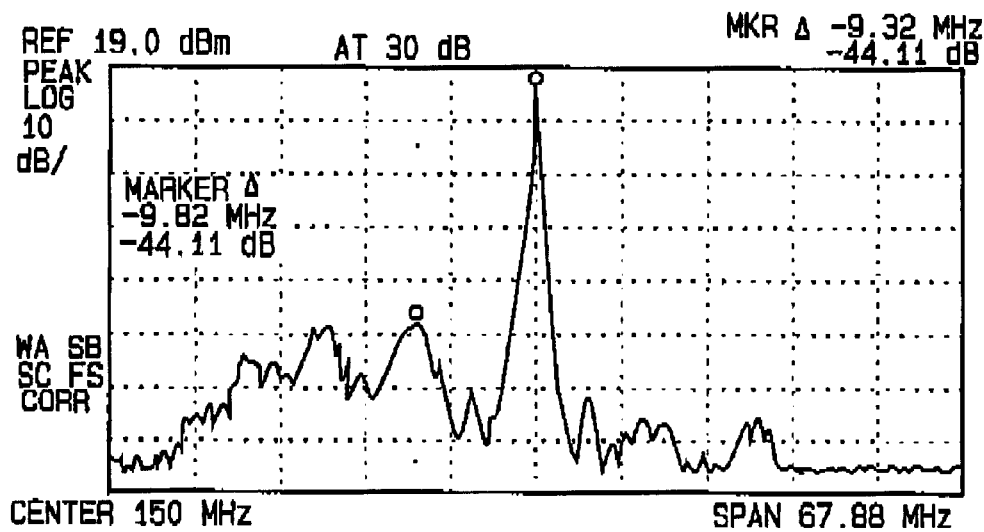
FIG. 12 is a plot of in-band and out-of-band spurious products in a plasma processing system that does not include 90-degree hybrids.
Figure 13:
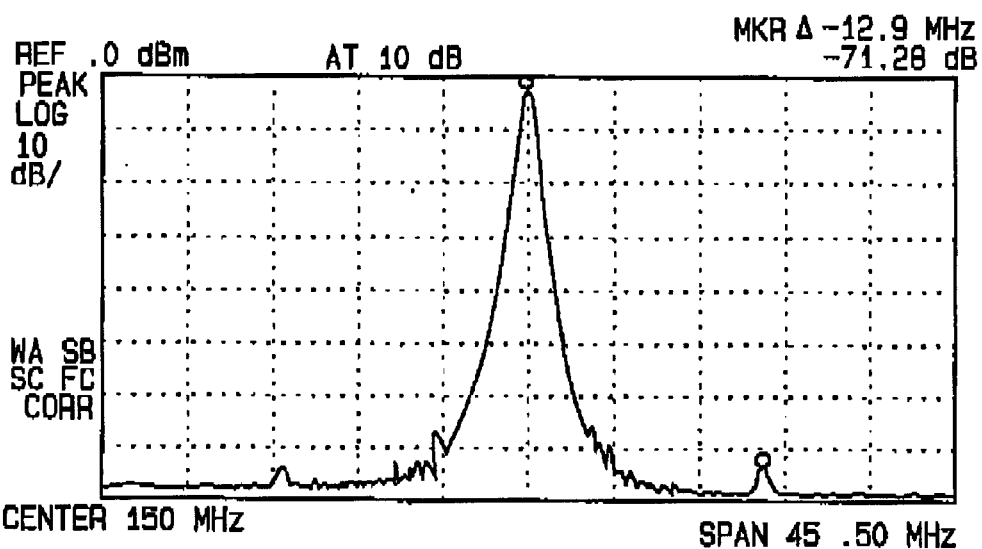
FIG. 13 is a plot of in-band and out-of-band spurious products in a plasma processing system that does include 90-degree hybrids.

Thus, configurations including the above-described combination of in-phase and 90-degrees splitters and combiners enhance stability and significantly improves reliability of the plasma processing system. The improved stability obtained by using 90-degrees hybrids is graphically represented in FIGS. 12 and 13. FIG. 12 is a plot of the in-band and out-of-band spurious products of a system taken from the forward port of the directional coupler 46 when an RF generator 10 configuration containing only in-phase splitters and combiners was connected via 6' cable to matching network 60 tuned to a 1.8-j63 Ohms load. On the low end of the system frequency bandwidth there is a hump of spurious products only 44 dB below the main frequency, causing system instability and potential components failure. In another configuration in which 90-degree splitter 82 and 90-degree combiner 94 were used instead of similar in-phase networks, the output signal was essentially perfectly clean, as shown in FIG. 13, with spurious products more than 70 dB below the main frequency.

The description of the invention is merely exemplary in nature and, thus, variations that do not depart from the gist of the invention are intended to be within the scope of invention. Such variations are not to be regarded as a departure from the spirit and scope and the invention.

What is claimed is:

1. A radio frequency (RF) generator apparatus for a plasma processing system that is resistant to nonlinear load mismatch conditions, said apparatus comprising:
   an RF oscillator configured to generate an RF signal;
   an RF amplifier responsive to said RF signal to produce a VHF RF signal having sufficient power to drive a plasma chamber load; and
   a VHF-band circulator coupled to said amplifier and configured to isolate nonlinearities of the plasma chamber load from said RF amplifier.

2. An apparatus in accordance with claim 1 wherein said VHF-band circulator comprises a Y-junction circulator.

3. An apparatus in accordance with claim 1 wherein said RF amplifier comprises a driver, a power amplifier, a first 90 degree hybrid coupler and a second 90 degree hybrid coupler, wherein said first 90 degree hybrid coupler is configured as a two-way splitter isolating said driver from said power amplifier, said power amplifier comprises two half-sections, and said second 90 degree hybrid coupler is configured as a 2-way combiner to combine outputs of both said half-sections of said power amplifier.

4. An apparatus in accordance with claim 1 further comprising a control board configured to adjust a frequency of said RF signal, a directional coupler having an input coupled to an output of said circulator to receive RF power therefrom and a sensor configured to provide, to said control board, a signal representative of an amount of RF power at said output of said circulator, wherein said control board is responsive to said signal representative of an amount of RF power to adjust said frequency of said RF signal.

5. An apparatus in accordance with claim 4 further comprising a low pass filter having an input coupled to an output of said directional coupler.

6. An apparatus in accordance with claim 5 further comprising a high pass filter having an input coupled to an output of said low pass filter and configured to shunt to ground RF harmonics in a signal coupled to the plasma chamber load.

7. An apparatus in accordance with claim 6 further comprising a load matching network having an input coupled to an output of said low pass filter and an output configured to provide power to the plasma chamber load, said load matching network configured to approximately match an output impedance of said apparatus to the plasma chamber load under one set of operating conditions.

8. An apparatus in accordance with claim 1 configured to produce at least 2.5 kilowatts of RF power at a VHF frequency.

9. An apparatus in accordance with claim 8 wherein said amplifier comprises no more than 16 output transistors in push-pull configurations.

10. An apparatus in accordance with claim 1 comprising a first chassis, a power supply housed within said first chassis and a control board configured to control said RF oscillator, and said amplifier, a second chassis separate from said first chassis, and a heat sink housed within said second chassis, wherein said second chassis also houses said amplifier and said VHF band circulator.

11. An apparatus in accordance with claim 1 wherein said VHF band circulator comprises lumped circuit elements.

12. An apparatus in accordance with claim 1 wherein said VHF band circulator comprises a passive, non-reciprocal ferrite device.

13. An apparatus in accordance with claim 1 wherein said RF oscillator comprises a direct digital synthesizer.

14. An apparatus in accordance with claim 1 wherein said RF oscillator comprises a voltage controlled oscillator operating in a phase locked loop.

15. A plasma processing system comprising:
   a plasma chamber; and
   a radio frequency (RF) generator apparatus operatively coupled to said plasma chamber to supply RF power thereto at a VHF frequency, said RF generator apparatus comprising an RF amplifier configured to produce said RF power supplied to said RF generator apparatus and a VHF-band circulator having an output configured to supply said RF power to said plasma chamber and to isolate nonlinearities of said plasma chamber from said RF amplifier.

16. A plasma processing system in accordance with claim 15 wherein said VHF band circulator comprises a Y-junction circulator.

17. A plasma processing system in accordance with claim 15 wherein said RF amplifier comprises a driver, a power amplifier, a first 90 degree hybrid coupler and a second 90 degree hybrid coupler, wherein said first 90 degree hybrid coupler is configured as a two-way splitter isolating said driver from said power amplifier, said power amplifier comprises two half-sections, and said second 90 degree hybrid coupler is configured as a 2-way combiner to combine outputs of both said half-sections of said power amplifier.

18. A plasma processing system in accordance with claim 15 further comprising a control board to adjust a frequency of said RF power provided to said plasma chamber, a directional coupler having an input coupled to an output of the circulator to receive RF power therefrom and a sensor configured to provide a signal representative of an amount of RF power at the output of said circulator to the control board, wherein said control board is responsive to said signal representative of an amount of RF power to adjust said frequency of said RF power.

19. A plasma processing system in accordance with claim 18 further comprising a low pass filter operatively coupled between said directional coupler and said plasma chamber to reduce harmonics in RF power passing through said directional coupler.

20. A plasma processing system in accordance with claim 19 further comprising a high pass filter configured to shunt said harmonics to ground.

21. A method for providing RF power at a VHF frequency to a non-linear plasma chamber load comprising:

generating VHF RF power in an RF generator output stage;

passing said VHF RF power through a VHF-band circulator; and applying the VHF RF power passed through the VHF band circulator to a plasma chamber load.

22. A method in accordance with claim 21 further comprising:

sensing an amount of RF power output from the RF generator output stage utilizing a directional couple;

adjusting a frequency of the RF power in accordance with the sensed amount of RF power; and isolating harmonics of the RF power from said directional coupler utilizing a low pass filter operatively coupled beetween the plasma chamber load and the VHF-band circulator/isolator.

23. A method in accordance with claim 22 further comprising shunting harmonics of saidRF power to ground beetween the plasma chamber load and the directional coupler.

24. A method in accordance with claim 22 further comprising adjusting a frequency of the RF power in accordance with the sensed amount of RF power.

\* \* \* \* \*

UNITED STATES PATENT AND TRADEMARK OFFICE
CERTIFICATE OF CORRECTION

PATENT NO. : 6,703,080 B2
DATED : March 9, 2004
INVENTOR(S) : Leonid E. Reyzelman et al.

It is certified that error appears in the above-identified patent and that said Letters Patent is hereby corrected as shown below:

Column 1,
Line 7, "the" should be -- The --.
Line 35, "water" should be -- wafer --.

Column 3,
Line 11, "$Vd_{ss}$" should be -- $V_{dss}$ --.

Column 7,
Line 60, "RFG-393" should be -- RG-393 --.

Column 8,
Line 3, "water" should be -- wafer --.

Column 9,
Line 16, "Chebychey" should be -- Chebychev --.

Column 12,
Line 54, "+0.2" should be -- ±0.2 --.
Line 55, "+1.5" should be -- ±1.5 --.
Line 64, "Rf" should be -- RF --.
Line 66, "kWV" should be -- kW --.

Column 17,
Line 10, "couple" should be -- coupler --.

UNITED STATES PATENT AND TRADEMARK OFFICE
CERTIFICATE OF CORRECTION

PATENT NO.     : 6,703,080 B2
DATED          : March 9, 2004
INVENTOR(S)    : Leonid E. Reyzelman et al.

It is certified that error appears in the above-identified patent and that said Letters Patent is hereby corrected as shown below:

<u>Column 18,</u>
Line 3, "beetween" should be -- between --.
Line 6, "saidRF" should be -- said RF --.
Line 7, "beetween" should be -- between --.

Signed and Sealed this

Twenty-sixth Day of July, 2005

JON W. DUDAS
*Director of the United States Patent and Trademark Office*